(12) United States Patent
Zhou et al.

(10) Patent No.: US 12,209,994 B2
(45) Date of Patent: Jan. 28, 2025

(54) METHOD AND METROLOGY TOOL FOR DETERMINING INFORMATION ABOUT A TARGET STRUCTURE, AND CANTILEVER PROBE

(71) Applicant: ASML Netherlands B.V., Veldhoven (NL)

(72) Inventors: Zili Zhou, Veldhoven (NL); Mustafa Ümit Arabul, Eindhoven (NL); Coen Adrianus Verschuren, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 96 days.

(21) Appl. No.: 17/634,711

(22) PCT Filed: Jul. 22, 2020

(86) PCT No.: PCT/EP2020/070683
§ 371 (c)(1),
(2) Date: Feb. 11, 2022

(87) PCT Pub. No.: WO2021/028174
PCT Pub. Date: Feb. 18, 2021

(65) Prior Publication Data
US 2022/0283122 A1 Sep. 8, 2022

(30) Foreign Application Priority Data

Aug. 14, 2019 (EP) ..................................... 19191736
Feb. 18, 2020 (EP) ..................................... 20158028

(51) Int. Cl.
*G01N 29/24* (2006.01)
*G01N 29/34* (2006.01)
*G03F 9/00* (2006.01)

(52) U.S. Cl.
CPC ..... *G01N 29/2418* (2013.01); *G01N 29/2462* (2013.01); *G01N 29/348* (2013.01);
(Continued)

(58) Field of Classification Search
CPC ........... G01N 29/2418; G01N 29/2462; G01N 29/348; G01N 2291/0427;
(Continued)

(56) References Cited

U.S. PATENT DOCUMENTS 7,701,577 B2   4/2010   Straaijer et al.
7,791,724 B2   9/2010   Den Boef et al.
(Continued)

FOREIGN PATENT DOCUMENTS

CN   104471484 A   3/2015
CN   105452962 A   3/2016
(Continued)

OTHER PUBLICATIONS

Laserbased Ultrasound for Characterization of Thin Films and Microstructures and Resulting Applications by Profunser. (Year: 2004).*
(Continued)

*Primary Examiner* — Xin Y Zhong
(74) *Attorney, Agent, or Firm* — Sterne, Kessler, Goldstein & Fox P.L.L.C.

(57) ABSTRACT

The disclosure relates to determining information about a target structure formed on a substrate using a lithographic process. In one arrangement, a cantilever probe is provided having a cantilever arm and a probe element. The probe element extends from the cantilever arm towards the target structure. Ultrasonic waves are generated in the cantilever probe. The ultrasonic waves propagate through the probe element into the target structure and reflect back from the target structure into the probe element or into a further probe
(Continued)

element extending from the cantilever arm. The reflected ultrasonic waves are detected and used to determine information about the target structure.

8 Claims, 10 Drawing Sheets

(52) U.S. Cl.
CPC ... *G03F 9/7061* (2013.01); *G01N 2291/0427* (2013.01); *G01N 2291/2697* (2013.01)

(58) Field of Classification Search
CPC ........ G01N 2291/2697; G01N 29/0654; G03F 9/7061; G03F 7/70633; G03F 9/7088; G01Q 10/045; G01Q 70/10; G01Q 60/32
See application file for complete search history.

(56) References Cited

U.S. PATENT DOCUMENTS

| | | | |
|---|---|---|---|
| 8,115,926 | B2 | 2/2012 | Straaijer |
| 8,553,227 | B2 | 10/2013 | Jordanoska |
| 8,681,312 | B2 | 3/2014 | Straaijer |
| 8,692,994 | B2 | 4/2014 | Straaijer |
| 8,792,096 | B2 | 7/2014 | Straaijer |
| 8,797,554 | B2 | 8/2014 | Straaijer |
| 8,823,922 | B2 | 9/2014 | Den Boef |
| 9,182,219 | B1* | 11/2015 | Manassen ............... H01L 22/30 |
| 9,714,827 | B2 | 7/2017 | Van Der Schaar et al. |
| 9,910,366 | B2 | 3/2018 | Middlebrooks et al. |
| 2010/0328655 | A1 | 12/2010 | Den Boef |
| 2011/0026032 | A1 | 2/2011 | Den Boef et al. |
| 2011/0102753 | A1 | 5/2011 | Van De Kerkhof et al. |
| 2011/0249244 | A1 | 10/2011 | Leewis et al. |
| 2012/0044470 | A1 | 2/2012 | Smilde et al. |
| 2012/0309116 | A1 | 12/2012 | Colgan et al. |
| 2013/0162996 | A1 | 6/2013 | Straaijer et al. |
| 2019/0079414 | A1 | 3/2019 | Straaijer |
| 2019/0310284 | A1* | 10/2019 | van Es ................. G01N 29/22 |

FOREIGN PATENT DOCUMENTS

| | | |
|---|---|---|
| EP | 1628164 A2 | 6/2006 |
| EP | 3258275 A1 | 12/2017 |
| EP | 3349017 A1 | 7/2018 |
| EP | 3349020 A1 | 7/2018 |
| WO | WO 2019076697 A1 | 4/2019 |

OTHER PUBLICATIONS

International Preliminary Report Patentability directed to related International Patent Application No. PCT/EP2020/070683, issued Feb. 8, 2022; 7 pages.
International Search Report and Written Opinion of the International Searching Authority directed to related International Patent Application No. PCT/EP2020/070683, mailed Oct. 20, 2020; 9 pages.
T. Sulchek et al., "Parallel atomic force microscopy with optical interferometric detection" Appl. Phys. Lett., vol. 78, No. 12, pp. 1787-1789, Mar. 19, 2001.
Dieter M., Profunser, "Laserbased ultrasound for characterization of thin films and microstructures and resulting applications," (Doctoral dissertation, ETH Zurich), 2004; 171 pages.
Yu et al., "Metamaterial perfect absorber with unabated size-independent absorption," vol. 26, No. 16, Opt. Express, pp. 20471-20480, Aug. 6, 2018.
Thomsen et al. "Surface generation and detection of phonons by picosecond light pulses," Phys. Rev. B, vol. 34, No. 6, pp. 4129-4138, Sep. 15, 1986.
Bryner et al "Wave propagation in pyramidal tip-like structures with cubic material properties," Wave Motion, 2010; pp. 33-44.
Chinese First Office Action directed to Chinese Patent Application No. 202080056802.8, mailed Feb. 28, 2024; 27 pages.

* cited by examiner

METHOD AND METROLOGY TOOL FOR DETERMINING INFORMATION ABOUT A TARGET STRUCTURE, AND CANTILEVER PROBE

FIELD OF THE INVENTION

This invention relates to determining information about a structure formed on a substrate using a lithographic process, particularly where the information is obtained using a cantilever probe and ultrasound.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (for example a mask) onto a layer of radiation-sensitive material (resist) provided on a substrate (for example a wafer).

As semiconductor manufacturing processes continue to advance, the dimensions of circuit elements become smaller and the amount of functional elements, such as transistors, per device increases, following a trend commonly referred to as Moore's law. To keep up with Moore's law the semiconductor industry is continually seeking technologies that enable smaller features to be created. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

Metrology tools are used in many aspects of the IC manufacturing process and include scatterometry based tools for inspecting/measuring the exposed and/or etched product in process control; e.g., to measure overlay.

Metrology tools are known that can measure overlay in target structures having pitches down to around 10 nm if the separation between the overlying layers (e.g. gratings formed in different layers) is of a similar order of size. Metrology tools are also known that can measure overlay between overlying layers that are spaced further apart, but only if the pitch of the target structures is also commensurately larger. It has been difficult to measure overlay in target structures having relatively small pitch (e.g. around 10 nm) and relatively large separation between the overlying layers (e.g. greater than 100 nm).

A further challenge is the increasing use of material layers that are not transparent to visible light, such as metal or carbon layers, or chalcogenide materials used for example in 3D memory applications. Portions of target structures below such opaque layers may not be accessible to many existing metrology techniques based on scatterometry.

SUMMARY OF THE INVENTION

It is an object of the invention to provide alternative or improved metrology techniques, for example to increase the range of situations in which metrology can be performed effectively.

According to an aspect, there is provided a method of determining information about a target structure formed on a substrate using a lithographic process, comprising: providing a cantilever probe, the cantilever probe comprising a cantilever arm and a probe element, the probe element extending from the cantilever arm towards the target structure; generating ultrasonic waves in the cantilever probe, the ultrasonic waves propagating through the probe element into the target structure and reflecting back from the target structure into the probe element or into a further probe element extending from the cantilever arm; and detecting the reflected ultrasonic waves and determining information about the target structure from the detected reflected ultrasonic waves.

According to an aspect, there is provided a metrology tool for determining information about a target structure formed on a substrate using a lithographic process, the metrology tool comprising: a cantilever probe having a cantilever arm and a probe element, the probe element configured to extend from the cantilever arm towards the target structure; an ultrasound generation system configured to generate ultrasonic waves in the cantilever probe, such that the ultrasonic waves propagate through the probe element into the target structure and reflect back from the target structure into the probe element or into a further probe element extending from the cantilever arm; and an ultrasound detection system configured to detect the reflected ultrasonic waves.

According to an aspect, there is provided a cantilever probe for use in a metrology tool for determining information about a target structure formed on a substrate using a lithographic process, the cantilever probe comprising: a cantilever arm; a probe element configured to extend from the cantilever arm towards the target structure; and a further probe element configured to extend from the cantilever arm towards the target structure, wherein: at least a portion of the probe element is tapered to have a cross-sectional area that decreases towards the target structure; and at least a portion of the further probe element is tapered to have a cross-sectional area that increases towards the target structure.

According to an aspect, there is provided a cantilever probe for use in a metrology tool for determining information about a target structure formed on a substrate using a lithographic process, the cantilever probe comprising: a cantilever arm; and a probe element configured to extend from the cantilever arm towards the target structure, wherein: the probe element comprises a first portion and a second portion, the first portion and the second portion being formed from different materials; the first portion comprises an outer sheath region and the second portion comprises a central region inside the outer sheath region, the central region and the outer sheath region being configured to act as a waveguide for ultrasonic waves propagating from the target structure through the probe element towards the cantilever arm.

According to an aspect, there is provided a cantilever probe for use in a metrology tool for determining information about a target structure formed on a substrate using a lithographic process, the cantilever probe comprising: a cantilever arm; and a probe element configured to extend from the cantilever arm towards the target structure, wherein: the probe element comprises a longitudinally proximal portion and a longitudinally distal portion; the longitudinally proximal portion is connected to the cantilever arm and extends from the cantilever arm to the longitudinally distal portion; and the longitudinally distal portion is configured to extend from the longitudinally proximal portion towards the target structure, wherein: the longitudinally distal portion is tapered to have a cross-sectional area that decreases towards the target structure and the longitudinally proximal portion comprises at least a portion that is not tapered or at least a portion that is tapered to have a cross-sectional area that decreases towards the cantilever arm.

BRIEF DESCRIPTION OF THE DRAWINGS

Embodiments of the invention will now be described, by way of example only, with reference to the accompanying schematic drawings, wherein like reference numerals designate like elements, and in which.

DETAILED DESCRIPTION

Figure 1:
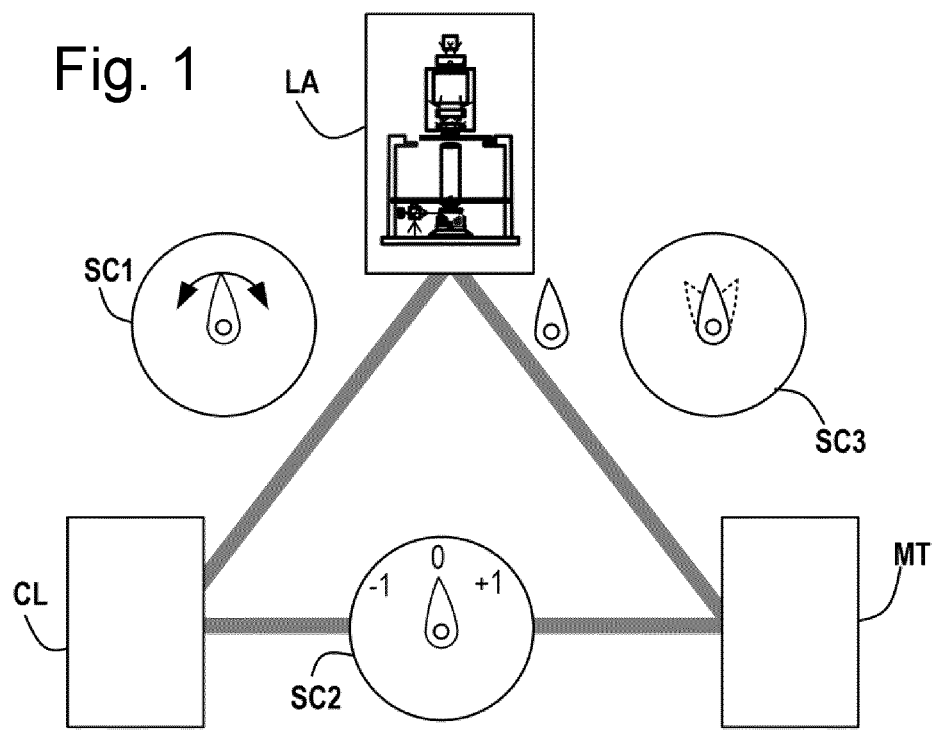
FIG. 1 depicts a schematic representation of holistic lithography, representing a cooperation between three technologies to optimize semiconductor manufacturing.

The patterning process performed by a lithographic apparatus LA in a lithographic process requires high accuracy of dimensioning and placement of structures on a substrate. To ensure this high accuracy, three systems may be combined in a so called "holistic" control environment as schematically depicted in FIG. 1. In the example shown, one of these systems is the lithographic apparatus LA which is (virtually) connected to a metrology tool MT (a second system) and to a computer system CL (a third system). An aim of such a "holistic" environment is to optimize cooperation between the three systems to enhance an overall process window and provide well defined control loops that ensure that patterning by the lithographic apparatus LA stays within the process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 1 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 1 by the arrow pointing to "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 1 by the multiple arrows in the third scale SC3).

In lithographic processes, it is desirable to make frequent measurements of the structures created, e.g., for process control and verification. Tools to make such measurements are typically called metrology tools MT. Different types of metrology tools MT for making such measurements are known, including scanning electron microscopes, atomic force microscopes and various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred to as pupil based measurements, or by having the sensor in the image plane or a plane conjugate with the image plane, in which case the measurements are usually referred to as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from soft x-ray and visible to near-IR wavelength range.

In one embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target arrangement and comparing the simulation results with those of a measurement. Parameters of the mathematical model are adjusted until the simulated interaction produces a diffraction pattern similar to that observed from the real target.

In another embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In another embodiment, the scatterometer MT is a ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922,587, 13/000,229, 13/033,135, 13/533,110 and 13/891,410 incorporated herein by reference in their entirety.

Figure 2:
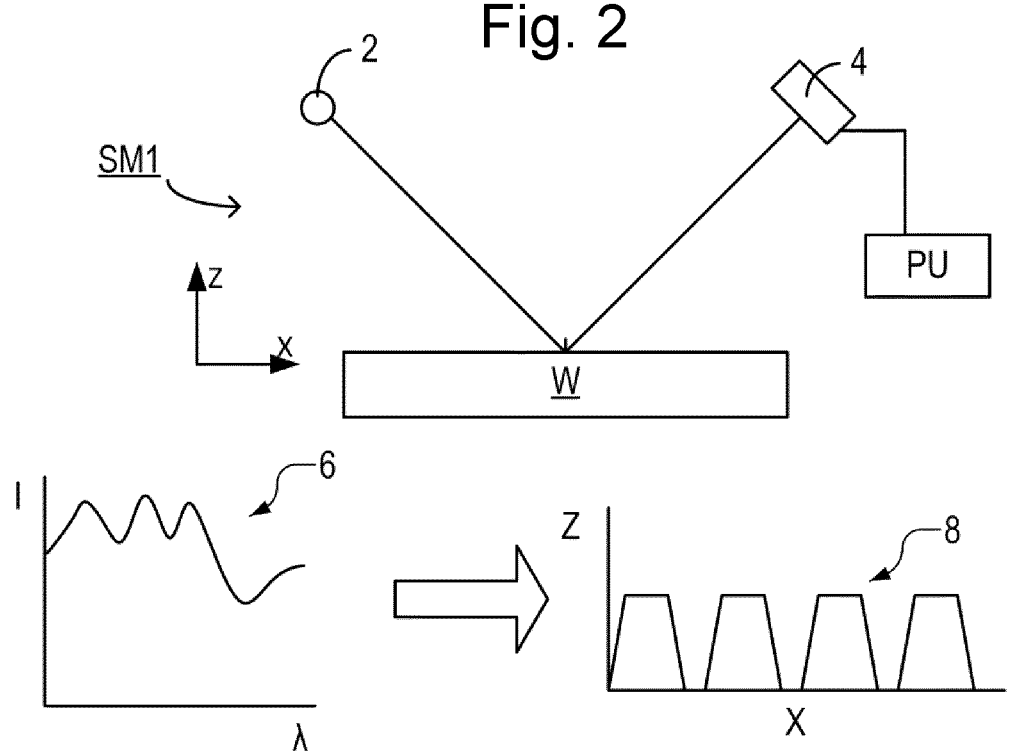
FIG. 2 depicts a schematic overview of a scatterometry apparatus used as a metrology device.

A metrology apparatus, such as a scatterometer, is depicted in FIG. 2. It comprises a broadband (white light) radiation projector 2 which projects radiation onto a substrate W. The reflected or scattered radiation is passed to a spectrometer detector 4, which measures a spectrum 6 (i.e. a measurement of intensity as a function of wavelength) of the specular reflected radiation. From this data, the structure or profile 8 giving rise to the detected spectrum may be reconstructed by processing unit PU, e.g. by Rigorous Coupled Wave Analysis and non-linear regression or by comparison with a library of simulated spectra as shown at the bottom of FIG. 2. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 3:
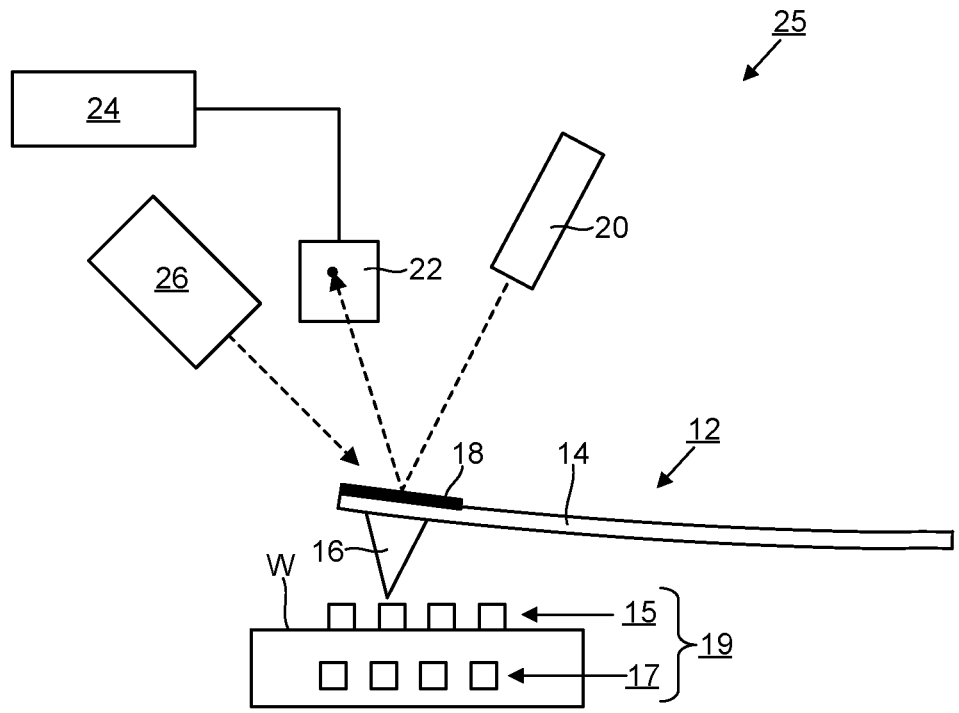
FIG. 3 is schematic side view of a metrology tool having a cantilever probe, an ultrasound generation system, and an ultrasound detection system.

In an embodiment, there is provided a cantilever probe 12, an example of which is depicted in FIG. 3. The cantilever probe 12 is configured to provide high spatial resolution information about features present below an outer surface of an entity to be investigated with minimal or no risk of damage to the entity. The cantilever probe 12 is provided as part of a measurement system 25. In some embodiments, examples of which are given below, the entity to be investigated is a target structure 19 formed on a substrate W using a lithographic process. In such embodiments, the measurement system 25 may be referred to as a metrology tool.

In an embodiment, the cantilever probe 12 comprises a cantilever arm 14 and a probe element 16. The probe element 16 extends from the cantilever arm 14 towards the target structure 19 on the substrate W (generally downwards in FIG. 3). In an embodiment, the cantilever arm 14 and probe element 16 are configured (e.g. via their material properties and dimensions) to be capable of performing the functions of the cantilever in a standard atomic force microscope. In an embodiment, either or both of the cantilever arm 14 and probe element 16 is/are formed from silicon.

In an embodiment, the measurement system 25 is configured to generate ultrasonic waves in the cantilever probe 12. The ultrasonic waves propagate through the probe element 16 and into the target structure 19. The ultrasonic waves are reflected back from the target structure 19 into the probe element 16 or into a further probe element 32 (described below) extending from the cantilever arm 14.

In an embodiment, the ultrasonic waves are generated in the cantilever probe 12 using the photoacoustic effect. In some embodiments of this type, the generation of the ultrasonic waves is performed by directing a laser beam onto the cantilever probe 12. In the example of FIG. 3, a laser beam is directed onto the cantilever probe 12 by a first laser unit 26. The first laser unit 26 may be considered as forming all or part of an ultrasound generation system.

The nature of the laser beam provided by the first laser unit 26 is not particularly limited as long as the required ultrasonic waves are generated. The laser beam may, for example, comprise a femtosecond laser. In one embodiment, a laser pulse of 200 fs is used with pulse energy of 6 nJ, which yields a peak power of 30 kW. The repetition rate of this pulse is around 50 MHz and the average power is on the order of 300 mW.

In an embodiment, as exemplified in FIG. 3, an ultrasound generation layer 18 is provided on the cantilever arm 14. The laser beam from the first laser unit 26 is directed onto the ultrasound generation layer 18 to generate ultrasonic waves in the ultrasound generation layer 18. In embodiments of this type, the combination of the first laser unit 26 and the ultrasound generation layer 18 may be considered as forming all or part of an ultrasound generation system. In an embodiment, the ultrasound generation layer 18 is configured to provide higher absorbance per unit area with respect to the laser beam from the first laser unit 26 than would the cantilever arm 14 in the absence of the ultrasound generation layer 18. It is also desirable for the photoacoustic conversion efficiency associated with the absorption to be high and stable. The ultrasound generation layer 18 desirably has both a high absorbance per unit area at the frequency of the laser beam from the first laser unit 20 and a thermal diffusion speed of the same order of magnitude as the laser pulse duration (e.g. of the order of femtoseconds) for high photoacoustic conversion efficiency. In an embodiment, the ultrasound generation layer 18 may comprise a metallic material, such as aluminium, gold or titanium. Alternatively or additionally, the ultrasound generation layer 18 may be arranged to comprise highly absorbing carbon-based materials, such as amorphous carbon. The ultrasound generation layer 18 may comprise a single layer having uniform composition through the thickness of the single layer. Alternatively, the ultrasound generation layer 18 may comprise a composite layer having multiple individual layers. In an embodiment, at least a subset of the individual layers have different compositions relative to each other. It is also desirable to arrange for efficient transmission of the generated ultrasonic waves, for example by avoiding excessive reflection at interfaces within the ultrasound generation layer 18 and/or between the ultrasound generation layer 18 and the cantilever arm 14. This can be achieved by reducing the size of acoustic impedance mismatches at the interfaces. In an embodiment, an impedance-matching layer is provided between the ultrasound generation layer 18 and the cantilever arm 14. The acoustic impedance of the impedence-matching layer is between an acoustic impedance of the ultrasound generation layer 18 and an acoustic impedance of the cantilever arm 14.

In an embodiment, the composition and dimensions of the ultrasound generation layer 18 are selected so that at least a portion of the ultrasonic waves generated in the ultrasound generation layer 18 have a frequency higher than 15 GHz, optionally higher than 50 GHz, optionally higher than 100 GHz. Providing ultrasonic waves in the range of 15 GHz to 50 GHz provides sub-micron resolution of spatial features within the target structure 19. Providing ultrasonic waves having a frequency higher than 100 GHz (e.g. in the range of 100 GHz to 200 GHz) provide nanometre resolution of spatial features within the target structure 19. Providing ultrasonic waves in the intermediate range of 50 GHz to 100 GHz provides intermediate resolution of spatial features.

The thickness of the ultrasound generation layer 18 may influence the frequency of the generated ultrasound. When the thickness of the ultrasound generation layer 18 is comparable to or smaller than the skin depth (with respect to the laser beam from the first laser unit 26), the thickness, t, of the ultrasound generation layer 18 and the frequency, f, of the ultrasound may be related according to $f=v/2t$ when v is the speed of sound in the ultrasound generation layer 18. If the thickness t is larger than the skin depth, the skin depth acts as a bottle neck. The skin depth is determined by the complex refractive index of the ultrasound generation layer 18.

Based on the above, forming the ultrasound generation layer 18 from a homogeneous layer of aluminium having a thickness of 30 nm, or a homogeneous layer of amorphous carbon having a thickness of 85 nm or less, would be suitable for generating ultrasonic waves have frequencies above 100 GHz. As explained above, the required thicknesses depend on the speed of sound in the ultrasound generation layer 18. With higher speeds of sound it possible to generate higher frequency ultrasound from the same thickness of material. However, increasing the speed of sound may also increase reflection losses at boundaries (where present) within the ultrasound generation layer 18 and/or between the ultrasound generation layer 18 and the cantilever arm 14. The thickness of the ultrasound generation layer 18 will typically be less than 500 nm, optionally less than 250 nm, optionally less than 100 nm, optionally less than 50 nm.

In some embodiments, the shape of the ultrasound generation layer 18 is configured to modify the nature (e.g. frequency) of the generated ultrasound and/or enhance the conversion efficiency. For example, the ultrasound generation layer 18 may comprise one or more patterns having features at length scales smaller than the wavelength of the laser beam from the first laser unit 26. In some embodiments, the ultrasound generation layer 18 may comprise one or more loops of material, optionally closed loops, optionally concentric circles. Alternatively, the ultrasound generation layer 18 may be provided as a checker-board pattern. Detailed dimensions and/or shapes of any of the ultrasound generation layers 18 configured in this way may be derived from vibrational mode analyses of the ultrasound generation layers 18.

In an embodiment, an ultrasound detection system is provided that detects the reflected ultrasonic waves reflected back from the target structure 19. In some embodiments, the detection of the reflected ultrasonic waves comprises detecting changes in an optical reflectivity of the cantilever probe 12. In the example of FIG. 3, the ultrasound detection system comprises a second laser unit 20 and photodetector 22. The second laser unit 20 directs a laser beam onto the cantilever probe 12. In the embodiment shown, the laser beam is directed onto the ultrasound generation layer 18. The laser beam is reflected off the cantilever probe 12 (e.g. off the ultrasound generation layer 18) and detected by the photodetector 22. A data processing system 24 is provided for determining information about the target structure 19 from the detected reflected ultrasonic waves.

In an embodiment, signal acquisition is performed in a pulse-echo imaging mode that switches between a transmit mode and a receive mode. In the transmit mode, first laser unit 26 generates ultrasonic waves in the cantilever probe 12. The generated ultrasonic waves are transmitted into the target structure 19 by contact between the cantilever probe 12 and the target structure 19 (e.g. via the probe element 16 of the cantilever probe 12). In the receive mode, the second laser unit 20 probes the reflectivity of the cantilever probe 12 (e.g. by directing a laser beam onto the ultrasound generation layer 18 that is reflected and detected by the photodetector 22). This approach makes it possible to distinguish easily between light reflected to the photodetector 22 from the first laser unit 26 and light reflected to the photodetector 22 from the second laser unit 20 because the first laser unit 26 and the second laser unit 22 are operational at different times. It is also possible, however, to transmit and receive the ultrasonic waves continually and use other techniques to distinguish reflections originating from the first laser unit 26 from reflections originating from the second laser unit 20. For example, the data processing system 24 may be configured to use lock-in amplifier or similar techniques to exploit frequency and/or phase differences between the laser beams from the first laser unit 26 and the second laser unit 20. In the embodiment shown in FIG. 3, the first laser unit 26 and the second laser unit 20 are separate devices. This is advantageous because the characteristics desired for the laser beam of the first laser unit 26 (e.g. high power) are normally different to the characteristics desired for the laser beam of the second laser unit 20 (e.g. lower power). In other embodiments, however, the first laser unit 26 and the second laser unit 20 may be provided by a single unit which generates laser light that is used both for generating the ultrasonic waves and detected changes in optical reflectivity containing information about ultrasonic waves reflected back from the target structure 19.

In an embodiment, the ultrasound detection system (e.g. the second laser unit 20 and the photodetector 22) is further configured to measure a deflection of the cantilever probe 12. This may be achieved for example by monitoring a variation in the position of a reflected radiation spot on the photodetector 22.

In comparison with alternative approaches in which ultrasonic waves are generated directly within the target structure 19, for example by an actuator on a back side of the target structure 19 opposite to an atomic force microscope cantilever, the above embodiments provide several advantages. Generating the ultrasonic waves directly in the target structure 19 can lead to errors caused by material dependent factors of the target structure 19. Furthermore, the highest acoustic frequency that is achievable is limited by the material properties of the target structure 19. Furthermore, the target structure 19 may be damaged by the process of generating the ultrasonic waves, which effectively limits the maximum power that can be used. Generating the ultrasonic waves in the cantilever arm 12 makes it possible to avoid these problems, thereby providing improved accuracy, improved spatial resolution via higher ultrasound frequencies, lower risk of damage to the target structure 19 and/or higher input powers without excessive risk of damage.

Optional configurations of the probe element 16 and/or further probe element 32 are now discussed with reference to FIGS. 4-11.

Figure 4:
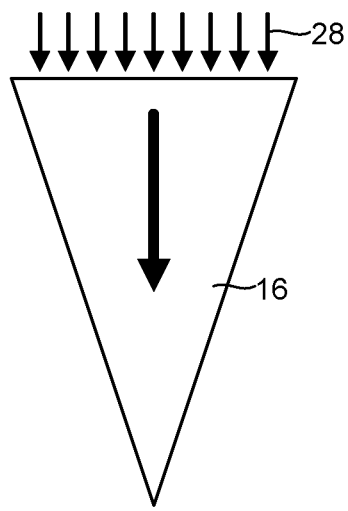
FIG. 4 is a schematic side sectional view of a probe element in a transmit mode.
Figure 5:
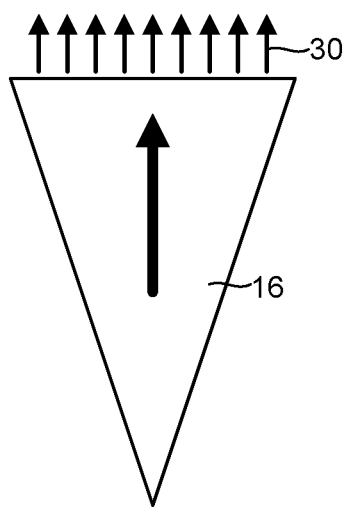
FIG. 5 is a schematic side sectional view of the probe element of FIG. 4 in a receive mode.

FIG. 4 depicts a probe element 16 operating in a transmit mode, with generated ultrasonic waves 28 entering the probe element 16 from the cantilever arm 14 (not shown) and propagating downwards through the probe element 16. FIG. 5 depicts the probe element 16 of FIG. 4 operating in receive mode, with reflected ultrasonic waves propagating upwards through the probe element 16 and leaving the probe element 16 (arrows 30) into the cantilever arm 14 (not shown). The probe element 16 is an example of a probe element that is tapered to have a cross-sectional area that decreases towards the target structure 19 (i.e. downwards). In this particular example, the tapering is provided over the whole vertical length of the probe element 16. The cross-sectional shape is not particularly limited but may be approximately circular for example, such that the tapered portion of the probe element 16 is conical. The tapered form acts to focus the ultrasonic waves 28 towards the target structure 19. However, the tapered form can also act to defocus reflected ultrasonic waves, making detection of the reflected ultrasonic waves more challenging. In an embodiment the probe element 16 is formed from alternating layers of materials having high and low acoustic refractive index. High acoustic refractive index material is Silicon, for example. Low acoustic refractive material may be air or PMMA, for example. The acoustic properties of the element 16 when formed from alternating layers of materials having high and low acoustic refractive index may be further controlled or improved by adjusting the pitch of the alternating layers or the filing ratio or the thickness of each layer.

The focusing provided by the tapered form of the probe element 16 results in the propagation of ultrasonic waves in the target structure 19 resembling propagation from a point source. Three-dimensional radiation from a point source results in the intensity falling inversely proportional to $r^2$, where r is the emission radius. The intensity reaching the bottom of the target structure 19 is thus reduced by a factor of $t^2$, where t is the thickness of the target structure 19. In the absence of counter measures, the reflected intensity reaching the top of the target structure 19 will thus be reduced by a factor of $t^4$ in comparison with the intensity of the ultrasonic waves at the tip of the probe element 16. Example approaches for improving detection efficiency are described below with reference to FIGS. 6-11. The approaches are based on separating the transmit and receive functionalities of the probe element 16 and reducing defocusing or even amplifying ultrasonic waves in the receive path.

Figure 6:
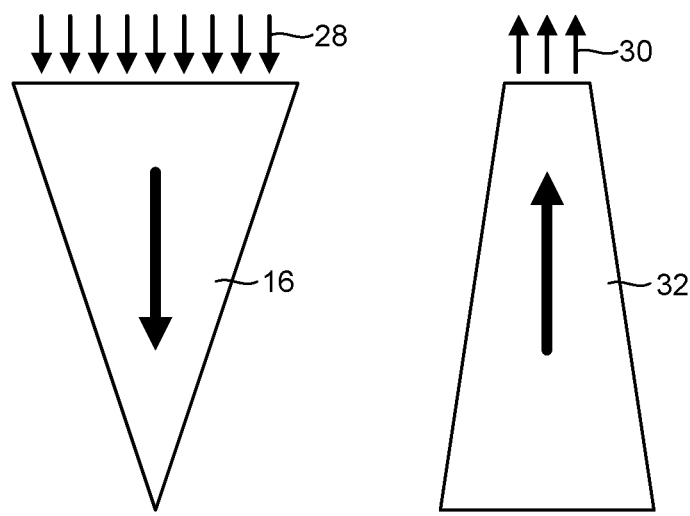
FIG. 6 is a schematic side sectional view of a probe element and further probe element.

In an embodiment, an example of which is depicted in FIG. 6, the cantilever probe 12 comprises two separate probe elements: a probe element 16 and a further probe element 32. The probe element 16 and further probe element 32 are configured so that the reflected ultrasonic waves are detected predominantly via the further probe element 32. In embodiments of this type, the ultrasonic waves generated in the cantilever probe 12 may propagate towards the target structure 19 predominantly through the probe element 16. The arrangement of FIG. 6 is thus an example of a configuration in which the probe element 16 is configured to direct the ultrasonic waves into the target structure 19 at a position that is different from a position from which the further probe element 32 receives the reflected ultrasonic waves. This approach makes it possible to optimise the probe element 16 and the further probe element 32 separately from each other, allowing optimal focusing of the ultrasonic waves both along the transmit and receive paths. The spatial separation between the probe element 16 and the further probe element 32 introduces some computational complexity but can be taken into account by the data processing system 24 when determining information about the target structure 19 from the detected reflected ultrasonic waves.

In an embodiment, at least a portion of the probe element 16 is tapered to have a cross-sectional area that decreases towards the target structure 19. In the example of FIG. 6, all of the probe element 16 is tapered. The tapering of the probe element 16 focuses the ultrasonic waves onto the target structure 19. In an embodiment, at least a portion of the further probe element 32 is tapered to have a cross-sectional area that increases towards the target structure 19. In the example of FIG. 6, all of the further probe element 32 is tapered. The tapering of the further probe element 32 focuses the reflected ultrasonic waves towards the ultrasound detection system, thereby improving signal-to-noise.

FIGS. 7-11 depict example embodiments in which the reflected ultrasonic waves are detected predominantly via the probe element 16. The further probe element 32 may be omitted in embodiments of this type.

Figure 7:
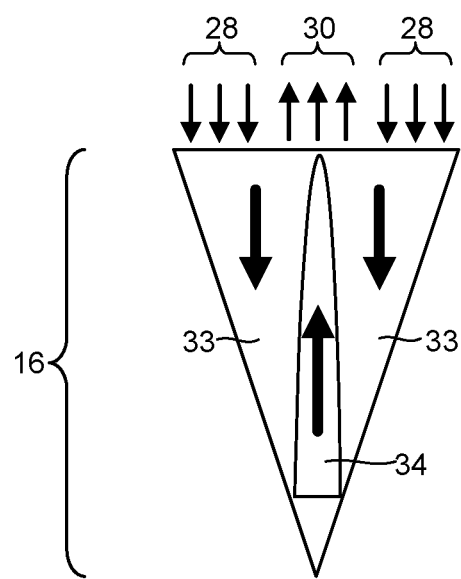
FIG. 7 is a schematic side sectional view of a probe element comprising first and second portions formed from different materials.

In an embodiment, as depicted in FIG. 7, the ultrasonic waves propagating towards the target structure 19 pass predominantly through a first portion 33 of the probe element 16 and the reflected ultrasonic waves propagating away from the target structure 19 pass predominantly through a second portion 34 of the probe element 16. The first portion 33 is different from the second portion 34. In an embodiment, the first portion 33 and the second portion 34 have different geometries. In an embodiment, the first portion 33 and the second portion 34 are formed from different materials.

In the particular example shown, the first portion 33 comprises an outer sheath region and the second portion 34 comprises a central region inside (e.g. radially surrounded by with respect to an average direction of propagation of the ultrasonic waves) the outer sheath region. The central region and the outer sheath region act as a waveguide for reflected ultrasonic waves propagating from the target structure 19 back through the probe element 16 towards the cantilever arm 14. The waveguide behaviour causes the reflected ultrasonic waves to propagate predominantly through the central region of the probe element 16. In an embodiment, the acoustic impedance of material forming the first portion 33 is higher than the acoustic impedance of material forming the second portion 34. Intricate structures such as shown in FIG. 7 can be manufactured relatively easily (e.g. using lithography) because at least a portion of the probe element 16 can be formed from silicon.

In an embodiment, at least a portion of the first portion 33 (e.g. outer sheath region) is tapered to have a cross-sectional area that decreases towards the target structure 19. As described above with reference to FIG. 6, the tapering focuses the ultrasonic waves onto the target structure 19. In an embodiment, at least a portion of the second portion 34 (e.g. central region) is tapered to have a cross-sectional area that decreases towards the cantilever arm 14. As described above with reference to FIG. 6, the tapering focuses the reflected ultrasonic waves towards the ultrasound detection system, thereby improving the signal-to-noise ratio.

Figure 8:
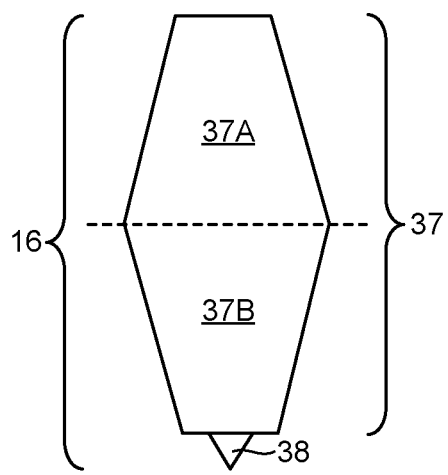
FIG. 8 is a schematic side sectional view of an example probe element having a longitudinally proximal portion and a longitudinally distal portion, wherein the longitudinally proximal portion has tapering both towards and away from the cantilever arm.
Figure 9:
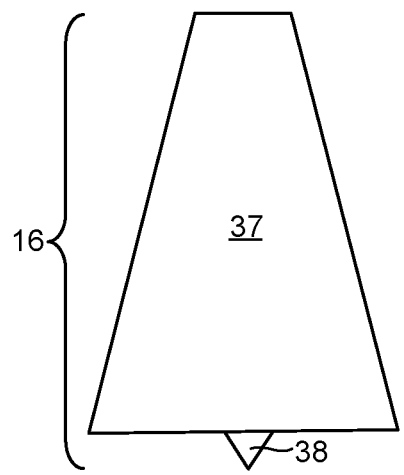
FIG. 9 is a schematic side sectional view of an example probe element having a longitudinally proximal portion and a longitudinally distal portion, wherein the longitudinally proximal portion tapers towards the cantilever arm.
Figure 10:
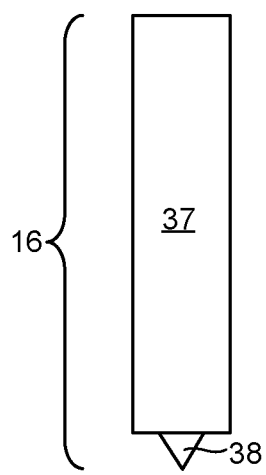
FIG. 10 is a schematic side sectional view of an example probe element having a longitudinally proximal portion and a longitudinally distal portion, wherein the longitudinally proximal portion has no taper but there is a discontinuity in cross-section between the longitudinally proximal portion and the longitudinally distal portion.

As exemplified in FIGS. 8-10, in some embodiments the probe element 16 comprises a longitudinally proximal portion 37 and a longitudinally distal portion 38. The longitudinally proximal portion 37 is connected to the cantilever arm 14 (not shown) and extends from the cantilever arm 14 to the longitudinally distal portion 38. The longitudinally distal portion 38 extends from the longitudinally proximal portion 37 towards the target structure 19 (not shown). The longitudinally distal portion 38 is tapered to have a cross-sectional area that decreases towards the target structure 19. The tapering focuses the ultrasonic waves onto the target structure 19. The longitudinally proximal portion 37 comprises at least a portion that is tapered to have a cross-sectional area that decreases towards the cantilever arm 14, as exemplified in FIGS. 8 and 9. In the example of FIG. 8, the longitudinally proximal portion 37 comprises a portion 37A that is tapered to have a cross-sectional area that decreases towards the cantilever arm 14 (not shown) and a portion 37B that is tapered to have a cross-sectional area that decreases towards the target structure 19 (not shown). In the example of FIG. 9, all of the longitudinally proximal portion 37 is tapered to have a cross-sectional area that decreases towards the cantilever arm 14. The tapering focuses the reflected ultrasonic waves towards the ultrasound detection system.

Figure 11:
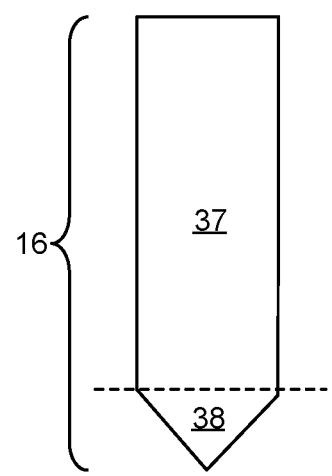
FIG. 11 is a schematic side sectional view of an example probe element having a longitudinally proximal portion and a longitudinally distal portion, wherein the longitudinally proximal portion has no taper and there is no discontinuity in cross-section between the longitudinally proximal portion and the longitudinally distal portion.

In an embodiment, the longitudinally proximal portion 37 comprises at least a portion that is not tapered, as exemplified in FIGS. 10 and 11. In FIGS. 10 and 11, the longitudinally proximal portion 37 has a constant cross-sectional area from the longitudinally distal portion 38 to the cantilever arm 14 (not shown). In FIG. 10, a discontinuity in cross-sectional area is present at the interface between the longitudinally proximal portion 37 and the longitudinally distal portion 38. In FIG. 11, the cross-sectional area transitions continuously across the interface between the longitudinally proximal portion 37 and the longitudinally distal portion 38. The lack of tapering facilitates manufacture while defocusing of the reflected ultrasonic waves towards the ultrasound detection system is reduced in comparison with tapered probe elements 16 of the type depicted in FIGS. 4 and 5. Providing a longitudinally distal portion that is tapered towards the target structure 19 provides a sharp tip that allows effective use of the cantilever probe 12 in a standard atomic force microscope mode. An advantageous balance of properties is thus achieved, allowing effective implementation of standard atomic force microscopy and the ultrasound-based measurements described above with the same cantilever arm 14.

Embodiments are now described in which the cantilever probe 12 is used specifically to determine information about a target structure 19 formed on a substrate using a lithography process. In this context, as depicted schematically in FIG. 12, the target structure 19 may comprise a first sub-structure 15 and a second sub-structure 17. The first sub-structure 15 overlies the second sub-structure 17. The information about the target structure 19 may comprise information about overlay (labelled ov in FIG. 12) between the first sub-structure 15 and the second sub-structure 17. The overlay represents a degree of misalignment between the first sub-structure 15 and the second sub-structure 17. As mentioned in the introductory part of the description, it has been difficult or impossible using existing techniques to measure overlay in target structures 19 having relatively small pitch (e.g. around 10 nm) and relatively large separation between the overlying layers (e.g. around 100 nm) and/or where material layers are present that are optically opaque. These challenges can be addressed using the ultrasound-based measurements described above. Examples approaches are described below.

In some embodiments, information about overlay is obtained by detecting the reflected ultrasonic waves at plural positions of the cantilever probe 12 relative to the target structure 19. In an embodiment, the plural positions are selected by using the cantilever probe in a standard atomic force microscope mode to detect positions of reference features in the first sub-structure 15. For example, in some embodiments, a profile of the first sub-structure 15 is obtained by measuring deflection of the cantilever arm 14 caused by interaction (e.g. contact) between the probe element 16 and the first sub-structure 15 for a plurality of positions of the probe element 16 relative to the first sub-structure 15 and information about the second sub-structure 17 (e.g. overlay relative to the first sub-structure 15 or another reference) is obtained from the detected reflected ultrasonic waves.

Figure 12:
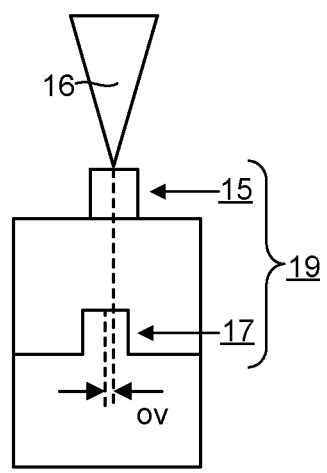
FIG. 12 is a schematic side sectional view depicting a probe element aligned with a peak of a first sub-structure.
Figure 14:
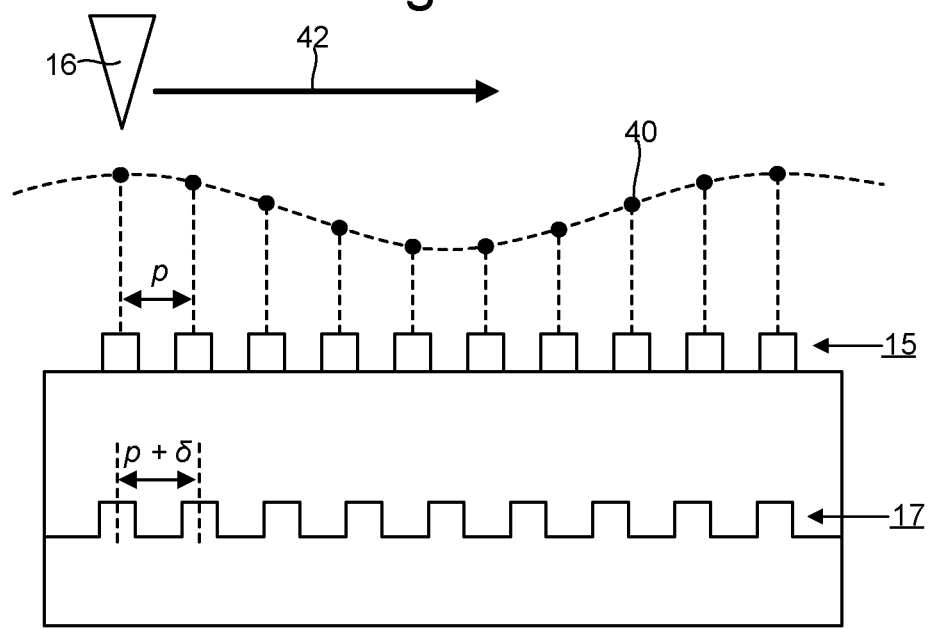
FIG. 14 is a schematic side sectional view of a target structure having sub-structures with different pitches and measurement of a resulting Moiré intensity pattern to determine overlay.

In an embodiment, the first sub-structure 15 and the second sub-structure 17 each comprise a plurality of repeating elements (e.g. grating lines or groups of grating lines), as depicted in FIG. 14. The reflected ultrasonic waves are detected at each of a set of positions of the target structure 19 relative to the cantilever probe 12. Each position of the target structure 19 relative to the cantilever probe 12 is a position at which the probe element 16 is aligned with a peak of a different one of the repeating elements of the first sub-structure 15 as depicted in FIG. 12. The alignment of the probe element 16 with each repeating element is determined by measuring a deflection of the cantilever arm 14 caused by interaction (e.g. contact) between the probe element 16 and the first sub-structure 15 (using a standard atomic force microscopy mode).

Figure 13:
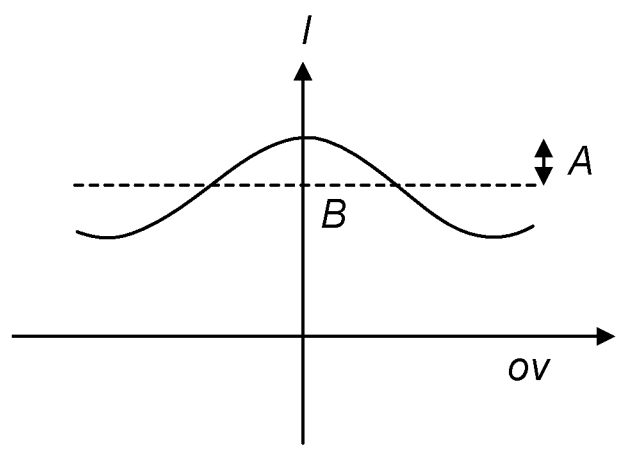
FIG. 13 depicts variation of a measured intensity I as a function of overlay ov when the probe element is aligned as shown in FIG. 12.

When the probe element 16 aligned with a peak of the first sub-structure 15 it is found that the intensity I of the reflected ultrasonic waves varies as a determinable function of the relative positions of the peak of the first sub-structure 15 and a corresponding underlying peak of the second sub-structure 17, which in turn depends on the overlay ov. The variation of the intensity I against overlay ov can be expressed as $$I = A \cdot \cos\left(\frac{2\pi}{p} ov\right) + B$$

and is depicted schematically in FIG. 13. The intensity I is maximal when the peak of the first sub-structure 15 with which the probe element 16 is aligned is itself aligned exactly with a corresponding peak in the second sub-structure 17.

Intensities I of the reflected ultrasonic waves are correlated with overlay ov but it is not possible to obtain overlay ov from these measurements in isolation. This issue can be addressed using a Moiré effect, as described below.

If the first sub-structure 15 comprises a grating having a pitch p, a signal $S_{top}$ representing a measured intensity of reflected ultrasonic waves, taken at each of a plurality of positions at which the probe element 16 is perfectly aligned with a peak (line) of the grating, is expected to vary as follows:

$$S_{top} = K \cdot \cos\left(\frac{2\pi x}{p} + \theta_{top}\right)$$

where x is a spatial coordinate in the direction of scanning 42 of the probe element 16 over the first sub-structure 15 and $\theta_{top}$ is a relative phase with respect to a starting point of the measurement. In an embodiment, as depicted in FIG. 14, the first sub-structure 15 is now arranged to have a different pitch to the second sub-structure 17. In FIG. 14, the pitch of the first sub-structure 15 is labelled p and the pitch of the second structure 17 is labelled p+δ. This difference in pitch results in a signal, $S_{Moiré}$, representing a measured intensity I of ultrasonic waves reflected from the target structure 19, comprising a beating term with respect to a variation with position of the probe element 16 relative to the target structure 19. The beating term has a frequency defined by a difference between the pitches of the first sub-structure 15 and the second sub-structure 17 and a phase defined by the overlay ov. The phase of the beating term can thus be detected and used to determine the overlay ov.

The signal $S_{Moiré}$ depends on the relative positions of the first sub-structure 15 and the second sub-structure 17 in a similar way to $S_{top}$ described above, but because of the differences in pitch between the first sub-structure 15 and the second sub-structure 17, the signal $S_{Moiré}$ can be expressed as the sum of two cosine functions, as follows:

$$S_{Moiré} = K \cdot \cos\left(\frac{2\pi x}{p} + \theta_{top}\right) + K \cdot \cos\left(\frac{2\pi x}{p+\delta} + \theta_{top} + \theta_{ov}\right)$$

which creates the beating frequency:

$$S_{Moiré} = 2K \cdot \cos\left(\frac{\frac{2\pi x}{2p(p+\delta)}}{2p+\delta} + \theta_{top} + \frac{1}{2}\theta_{ov}\right)\cos\left(\frac{\frac{2\pi x}{2p(p+\delta)}}{\delta} + \frac{1}{2}\theta_{ov}\right)$$

The overlay induced phase term is expressed as $\theta_{ov}$. The second cosine term in $S_{Moiré}$ represents the low frequency beating.

In FIG. 14, values of $S_{Moiré}$ are obtained at plural points 40 corresponding to alignment of the probe element 16 with different ones of the peaks of the first sub-structure 15. Eventually, a cosine function can be fitted through the points 40 (indicated by the curved broken line). $\theta_{ov}$ can then be determined from the phase of the fitted cosine function to obtain the overlay ov between the first sub-structure 15 and the second sub-structure 17. Because the period of the beating part of the signal $S_{Moiré}$ can be made relatively large, the shift of position corresponding to an overlay ov can also be made large, thereby providing high sensitivity.

The above approach allows overlay ov to be obtained with high sensitivity and without requiring measurements of the reflected ultrasonic waves at a large number of positions. The technique can be applied using measurements taken only at a plurality of positions corresponding to alignment between the probe element 16 and different peaks of the first sub-structure 15.

An alternative embodiment is now discussed in which deliberately applied overlay biases are used to obtain overlay ov. As mentioned above, an intensity I of reflected ultrasonic waves measured at any position of the probe element 16 that is aligned with a peak in the first sub-structure 15 varies as a function of overlay according to a cosine function:

$$I = A \cdot \cos\left(\frac{2\pi}{p}ov\right) + B$$

The overlay ov is, however, normally a relatively small value, which means that the variation of intensity I with ov is non-linear and relatively weak. In an embodiment, the variation of intensity I with ov is improved by using a target structure 19 that comprises multiple sub-targets with one or more of the sub-targets having overlay biases deliberately applied to them. In some embodiments of this type, the target structure 19 comprises a first sub-target and a second sub-target. The first and second sub-targets may be positioned in close proximity to each other on a substrate W, such as directly adjacent to each other. The first sub-target and the second sub-target each comprise two sub-structures with a deliberately applied overlay bias between the two sub-structures. The sub-structures of each sub-target may overlay each other in the same manner as the first sub-structure 15 and second sub-structure 17 described above with reference to FIGS. 12 and 14 for example. The overlay bias of the first sub-target is different to the overlay bias of the second sub-target. This difference shifts the cosine variation mentioned above and improves variation of I with ov.

In some embodiments the overlay bias of the first sub-target is equal to and opposite to the overlay bias of the second sub-target. In an embodiment, the two sub-structures of the first sub-target and the two sub-structures of the second sub-target have the same pitch p, an overlay bias of +p/4 is applied to the first sub-target and an overlay bias of −p/4 is applied to the second sub-target. This converts the cosine dependence of the I respect to ov to a sine dependence, thereby providing a linear and relatively steep variation of I with ov for small values of ov. This is explained below.

The respective intensities $I_1$ and $I_2$ of reflected ultrasonic waves from the first sub-target and the second sub-target, where respective +p/4 and −p/4 biases are applied can be written as follows:

$$I_1 = A \cdot \cos\left[\frac{2\pi}{p}\left(-\frac{p}{4}+ov\right)\right] + B = A \cdot \sin\left(\frac{2\pi}{p}ov\right) + B$$

$$I_2 = A \cdot \cos\left[\frac{2\pi}{p}\left(+\frac{p}{4}+ov\right)\right] + B = -A \cdot \sin\left(\frac{2\pi}{p}ov\right) + B$$

From which it follows that $$I_1 - I_2 = 2A \cdot \sin\left(\frac{2\pi}{p} ov\right)$$

and for small ov the difference ΔI in intensity is approximately given by $$\Delta I = \frac{4\pi A}{p} ov = K \cdot ov$$

where K=4πA/p.

The value of K can be pre-derived using calibration measurements, such that ov can be obtained from measurements of ΔI. For example, the value of the constant K could be determined using a set of calibration targets with a set of programmed bias values (e.g. ranging from −p to +p). Once K is learned by calibration, only two sub-targets (e.g. with offsets of +p/4 and −p/4) are needed to determine the overlay ov. Thus, overlay can be determined from a difference between: an intensity of a detected reflected ultrasonic wave from the first sub-target when the probe element is aligned with a peak of a repeating element of the sub-structure closest to the probe element of the first sub-target (e.g. an uppermost sub-structure in the first sub-target); and an intensity of a detected reflected ultrasonic wave from the second sub-target when the probe element is aligned with a peak of a repeating element of the sub-structure closest to the probe element of the second sub-target (e.g. an uppermost sub-structure in the second sub-target).

In some embodiments, the need for calibration measurements is reduced or removed by using further sub-targets. In one class of such an embodiment, depicted schematically in FIG. 15, the target structure 19 comprises a first sub-target 51, second sub-target 52, third sub-target 53, and fourth sub-target 54. The first sub-target 51, second sub-target 52, third sub-target 53 and fourth sub-target 54 each comprise two sub-structures with a deliberately applied overlay bias between the two sub-structures. The overlay biases of the first sub-target 51, second sub-target 52, third sub-target 53 and fourth sub-target 54 are all different from each other. The two sub-structures of each of the first sub-target 51, second sub-target 52, third sub-target 53 and fourth sub-target 54 have the same pitch p. The overlay bias of the first sub-target 51 is −A+B. The overlay bias of the second sub-target 52 is A+B. The overlay bias of the third sub-target 53 is −A−B. The overlay bias of the fourth sub-target 54 is A−B. A and B are constants. The overlay ov can be determined from a combination of $I_1$, $I_2$, $I_3$, and $I_4$, where $I_1$, $I_2$, $I_3$, and $I_4$ are defined as follows. $I_1$ is an intensity of a detected reflected ultrasonic wave from the first sub-target when the probe element is aligned with a peak of a repeating element of the sub-structure closest to the probe element of the first sub-target. $I_2$ is an intensity of a detected reflected ultrasonic wave from the second sub-target when the probe element is aligned with a peak of a repeating element of the sub-structure closest to the probe element of the second sub-target. $I_3$ is an intensity of a detected reflected ultrasonic wave from the third sub-target when the probe element is aligned with a peak of a repeating element of the sub-structure closest to the probe element of the third sub-target. $I_4$ is an intensity of a detected reflected ultrasonic wave from the fourth sub-target when the probe element is aligned with a peak of a repeating element of the sub-structure closest to the probe element of the fourth sub-target.

Figure 15:
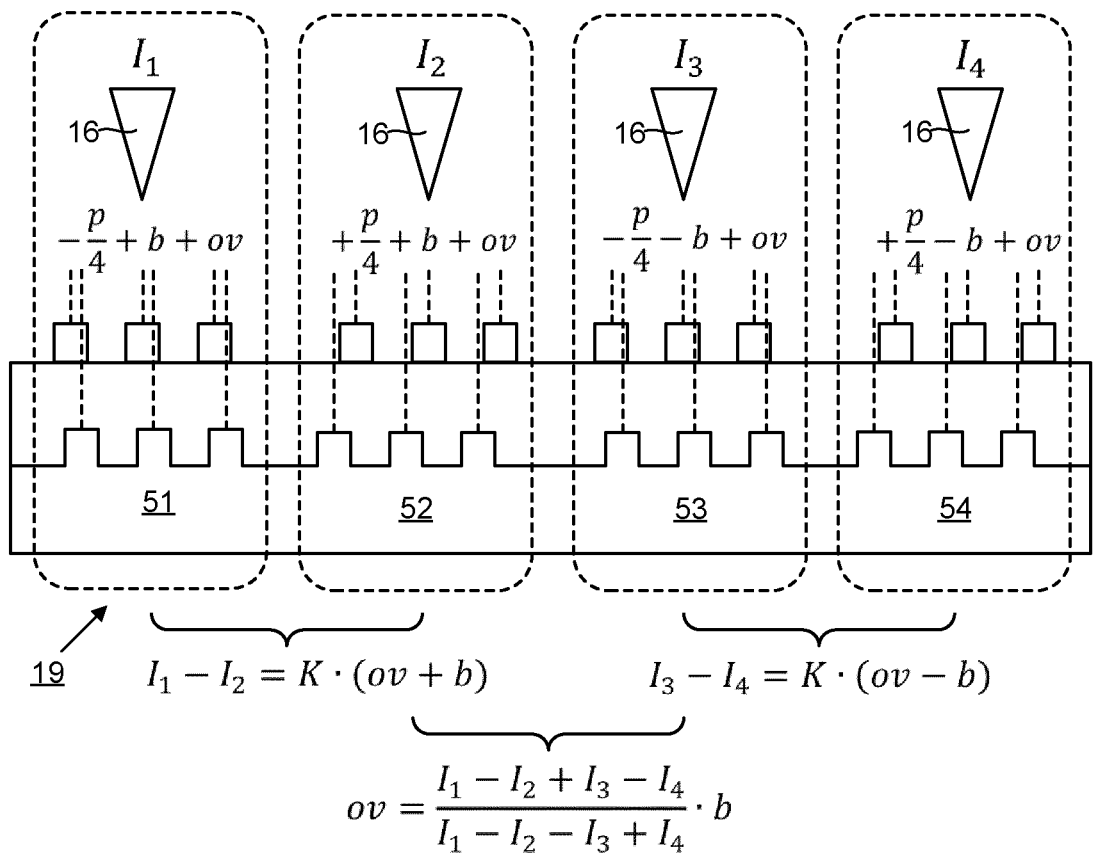
FIG. 15 is a schematic side sectional view of a target structure comprising four sub-targets with different deliberately applied biases.

In an embodiment, A=p/4, which results in the following relationships being true, as depicted in FIG. 15:

$$I_1 - I_2 = K \cdot (ov+b)$$

$$I_3 - I_4 = K \cdot (ov-b)$$

Overlay ov can then be obtained according to the following:

$$ov = \frac{I_1 - I_2 + I_3 - I_4}{I_1 - I_2 - I_3 + I_4} \cdot b$$

As an example, for a target structure having a pitch p of 60 nm, taking a value of b=5 nm would mean sub-targets with respective biases of −10 nm, 20 nm, −20 nm and 10 nm. Each sub-target can have multiple peaks/lines (e.g. 3 peaks/lines per sub-target as in FIG. 15). Within any given sub-target the detected intensity I should be the same for each peak/line but measuring multiple peaks improves signal-to-noise ratio.

Figure 16:
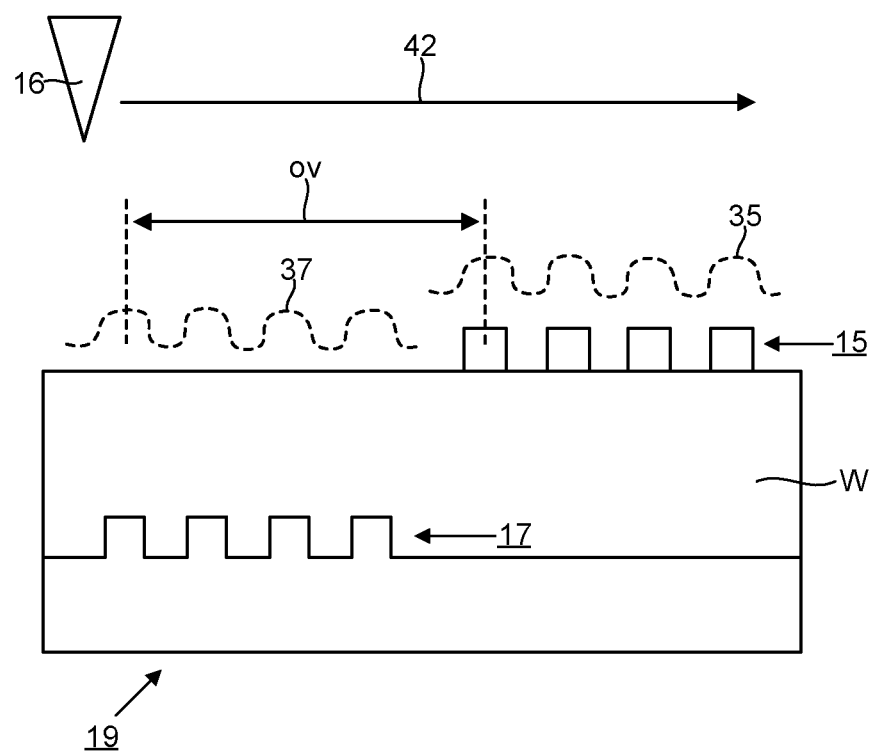
FIG. 16 is a schematic side sectional view of a target structure in which a first sub-structure is displaced laterally relative to a second sub-structure so that at least a portion of the second sub-structure does not overlap with any of the first sub-structure when viewed perpendicularly to a plane of the substrate.

FIG. 16 depicts an alternative approach in which a target structure 19 is provided in which the first sub-structure 15 is (deliberately) displaced laterally relative to the second sub-structure 17 so that at least a portion of the second sub-structure 17 does not overlap with any of the first sub-structure 15 when viewed perpendicularly to a plane of the substrate W. A profile 35 of the first sub-structure 15 can then be obtained by measuring deflection of the cantilever arm 14 caused by interaction (e.g. contact) between the probe element 16 and the first sub-structure 15 for a plurality of positions of the probe element 16 relative to the first sub-structure 15. A profile 37 of the second sub-structure 17 is obtained by detecting the reflected ultrasonic waves for a plurality of positions of the probe element 16 relative to the second sub-structure 17 within the portion of the second sub-structure 17 that does not overlap with any of the first sub-structure 15. The lateral displacement of the sub-structures thus allows the cantilever probe 12 to measure each sub-structure separately without any interference between the two sub-structures. The uppermost first sub-structure 15 can be measured using the standard atomic force microscopy approach while the submerged second sub-structure 17 can be measured via the reflected ultrasonic waves without the reflection process being disrupted by any overlying sub-structure that is not part of the second sub-structure 17. Because the size of the deliberately applied lateral displacement is known, overlay can be determined from a displacement between the measured profiles 35 and 37, as indicated schematically on FIG. 16.

Figure 17:
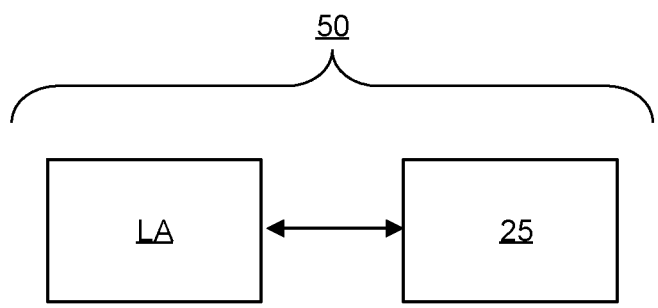
FIG. 17 depicts a lithography system.
Figure 18:
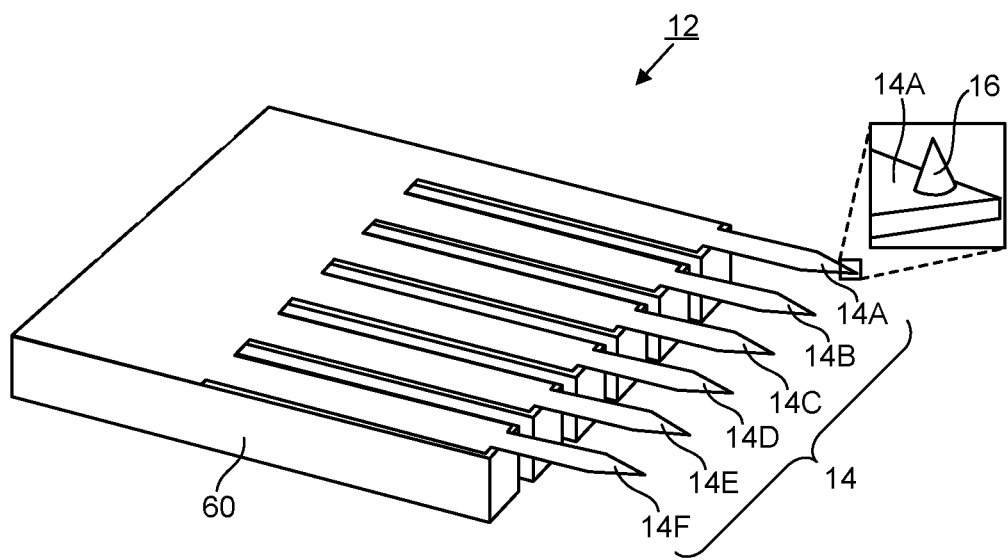
FIG. 18 is a schematic perspective view of a cantilever probe comprising a plurality of cantilever arms.

In some embodiments, as exemplified in FIG. 18, the cantilever probe 12 comprises a plurality of the cantilever arms 14 (labelled 14A-14F in FIG. 18). Each cantilever arm 14 may be configured and/or arranged to operate in any of the ways described above with reference to FIGS. 3-17. Each cantilever arm 14 comprises a respective probe element 16 (e.g. such that there is at least one probe element 16 for each cantilever arm 14 being considered). Each probe element 16 may take any of the forms described above with reference to FIGS. 3-17. Each probe element 16 is configured to extend in use from the cantilever arm 14 (with which that probe element 16 is associated) towards a target structure 19 (not shown in FIG. 18). As shown in the inset at the top right of FIG. 18, in the example of FIG. 18 the probe elements 16 face upwards in the orientation of the figure. The target structure 19 would thus be positioned above the cantilever probe 12 in the orientation of this figure. In FIGS. 19-22, the probe elements 16 face downwards so the target structure 19 would be positioned below the cantilever probe 12 in the orientations of these figures. In the examples shown, the cantilever arms 14 are provided on a support structure 60. Protruding tip regions of the cantilever arms 14 protrude over an edge of the support structure 60. In such embodiments, the probe elements 16 are attached to the protruding tip portions.

In some embodiments having a plurality of cantilever arms 14, the generating of ultrasonic waves in the cantilever probe 12 (which may be performed using a suitably adapted version of the ultrasound generation system discussed above) causes ultrasonic waves to propagate through each respective probe element 16 into the target structure 19. In the example of FIG. 18, the ultrasonic waves may thus propagate through different probe elements 16 extending from two or more of the cantilever arms 14 (optionally through a probe element 16 on each and every one of the cantilever arms 14). In an embodiment, the detecting of reflected ultrasonic waves (which may be performed using a suitably adapted version of the ultrasound detection system discussed above) comprises detecting reflected ultrasonic waves from each of the respective probe elements 16.

Performing the generation and detection of ultrasonic waves via multiple probe elements 16 makes it possible for multiple measurements to be performed in parallel, thereby improving overall measurement speed. In embodiments where the cantilever probe 12 is manufactured via etching of a silicon wafer or similar, it is not significantly more difficult to manufacture a cantilever probe 12 having multiple cantilever arms 14 than to manufacture a cantilever probe 12 having a single cantilever arm 14. The etch pattern can be adjusted easily and the rest of the procedure will not normally need significant adaption.

As described earlier, ultrasonic waves can be generated in cantilever probes 12 using the photoacoustic effect. The radiation using to generate the ultrasonic waves may be referred to as pump radiation in this context. The pump radiation may comprise a laser beam 70. The laser beam 70 may be provided by a first laser unit 26 as described above with reference to FIG. 3.

Figure 19:
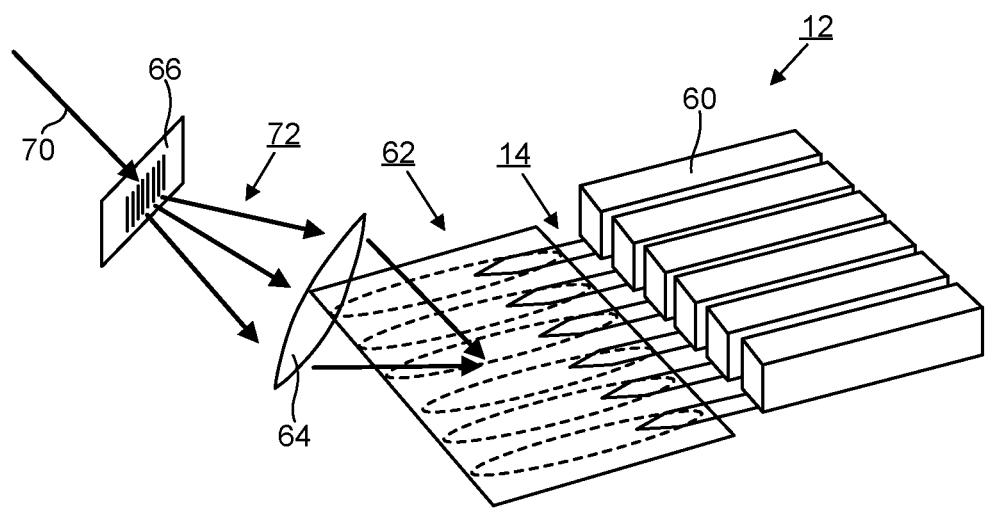
FIG. 19 depicts generation of ultrasonic waves in a cantilever probe of the type depicted in FIG. 18 by irradiating the cantilever arms with structured illumination formed using diffraction.
Figure 20:
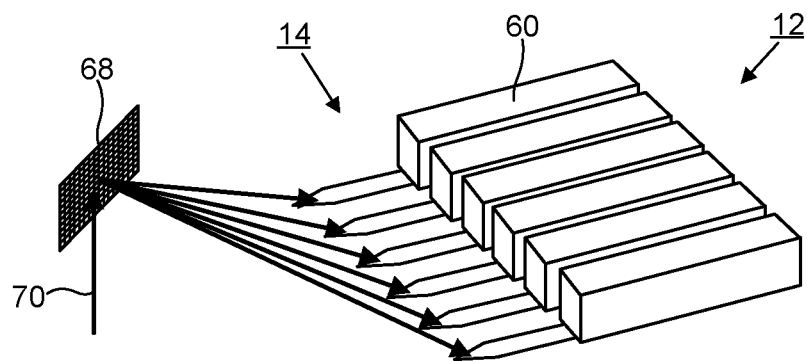
FIG. 20 depicts generation of ultrasonic waves in a cantilever probe of the type depicted in FIG. 18 by irradiating the cantilever arms with structure illumination formed using an array of individually controllable elements.

In some embodiments, as exemplified in FIGS. 19 and 20, the laser beam 70 is optically processed to provide a structured illumination that matches a spatial distribution of the plurality of cantilever arms 14. The structured illumination may be characterized, for example, by a pitch that is at least approximately equal to a pitch of the cantilever arms 14. In some embodiments, the optical processing of the laser beam 70 may comprise dividing the laser beam 70 into a plurality of sub-beams. Each sub-beam is then directed (e.g. focused) onto a different respective one of the plurality of cantilever arms 14.

In an embodiment, as depicted schematically in FIG. 19, the optical processing (e.g. dividing) of the laser beam 70 to provide the structured illumination is performed by diffraction. In the example shown, the laser beam 70 is directed through a diffraction grating 66 to produce diffracted radiation 72. The diffracted radiation 72 is focused by optics 64 to form a fringe pattern 62 on the cantilever arms 14. The fringe pattern 72 corresponds to the structured illumination. The diffraction grating 66 and optics may be configured so that a pitch of the fringe pattern 62 matches a pitch of the cantilever arms 14. The cantilever arms 14 may thus receive radiation from respective maxima in the fringe pattern. Multiple cantilever arms 14 can thereby be pumped simultaneously in an efficient and simple manner Power from the laser beam 70 can be constrained to fall predominantly or exclusively on the cantilever arms 14, thereby allowing best use to be made of the laser power available. Furthermore, stray light that could cause undesirable photoacoustic effects in the target structure 19 and/or surroundings can be minimized or eliminated.

In another embodiment, as depicted schematically in FIG. 20, the optical processing (e.g. dividing) of the laser beam 70 is performed using an array 68 of individually controllable elements. The array 68 may, for example, comprise an array of individually controllable micro-mirrors or microlenses. The use of an array 68 of individually controllable elements enhances flexibility. For example, the timing of exposure of each cantilever arm 14 to radiation (and, as a consequence, the generation of ultrasonic waves in the probe element 16 of each cantilever arm 14) can be controlled flexibly. In some embodiments, the array 68 of individually controllable elements may be used to illuminate all of the cantilever arms 14 simultaneously (in a similar way to the arrangement of FIG. 19 where diffraction is used to split the laser beam 70). In other embodiments, the array 68 of individually controllable elements is configured to illuminate different cantilever arms 14 at different times. The array 68 of individually controllable elements may, for example, be controlled to illuminate individual cantilever arms 14 one by one in sequence. Alternatively or additionally, selective activation of the individually controllable elements may be used to implement signal processing techniques, such as synthetic aperture imaging or coded excitation. Such signal processing techniques can be used to improve resolution and/or depth-of-imaging performance.

Figure 21:
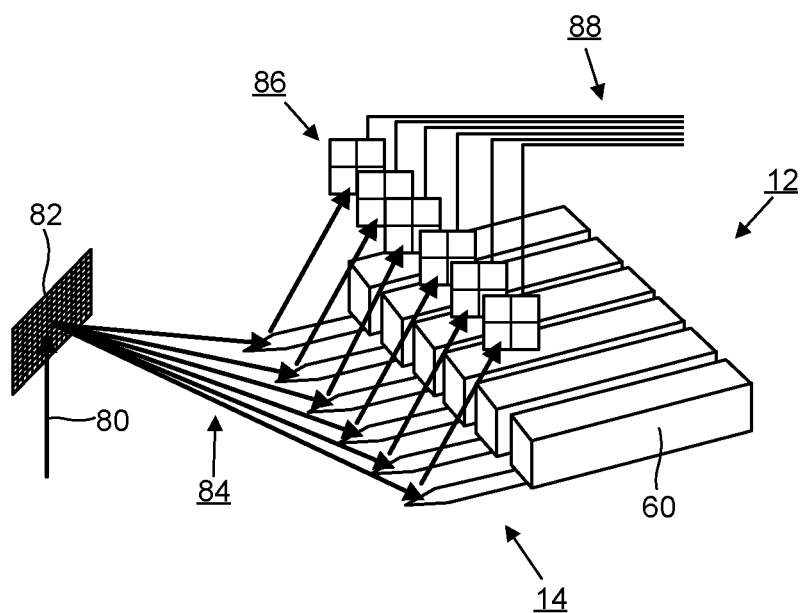
FIG. 21 depicts detection of reflected ultrasonic waves in a cantilever probe of the type depicted in FIG. 18 using structured illumination formed using an array of individually controllable elements.
Figure 22:
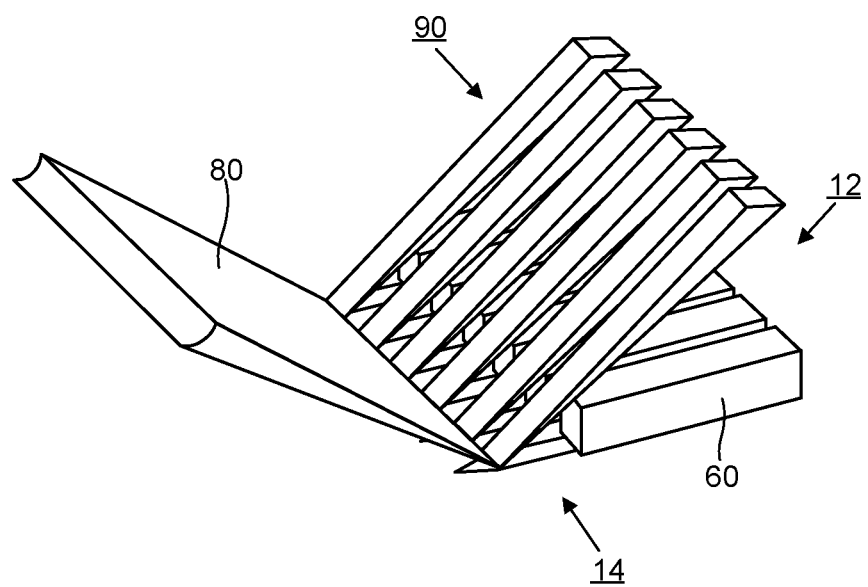
FIG. 22 depicts detection of reflected ultrasonic waves in a cantilever probe of the type depicted in FIG. 18 using a probe beam of radiation that is focused into a line focus intersecting plural cantilever arms of the cantilever probe.

In some embodiments, as exemplified in FIGS. 21 and 22, the detecting of reflected ultrasonic waves comprises directing a probe beam 80 of radiation onto the cantilever arms 14 and detecting radiation reflected from the cantilever arms 14. The probe beam 80 may, for example, be provided by a second laser unit 20, as described above with reference to FIG. 3. The detected reflected radiation may be used to measure changes in reflectivity of the cantilever arm 14. The changes in reflectivity provide information about reflected ultrasonic waves.

In an embodiment, as depicted schematically in FIG. 21, the probe beam 80 is optically processed (e.g. divided) to provide a structured illumination that matches a spatial distribution of the plurality of cantilever arms 14. In an embodiment, the probe beam 80 is divided into a plurality of sub-beams 84. Each sub-beam 84 is then directed onto a different respective one of the plurality of cantilever arms 14. In the example shown, the optical processing of the probe beam 80 is performed using an array 82 of individually controllable elements. The array 82 may, for example, comprise an array of individually controllable micro-mirrors or microlenses. The radiation reflected from each of the cantilever arms 14 may be detected in parallel to increase readout speed. In the example of FIG. 21, a separate detector 86 (e.g. a photodiode sensor) is provided for detecting radiation reflected from each respective cantilever arm 14 (such that six detectors 86 are provided in the example shown). Signal lines 88 allow the measurements to be sent in parallel to a data processing system for determining information about the target structure 19 from the detected reflected ultrasonic waves.

In another embodiment, as depicted in FIG. 22, the probe beam 80 is focused into a line focus. The line focus may be created using a cylindrical lens, for example. The line focus is arranged to intersect the plurality of cantilever arms 14. The intersection of the line focus with the plurality of cantilever arms 14 allows focused radiation to be provided simultaneously to the plurality of cantilever arms 14 in a convenient and controllable manner. The output radiation 90 may be captured and analysed in various ways. In one embodiment, an interferometry approach is used, for example as described in T. Sulchek et al., "Parallel atomic force microscopy with optical interferometric detection," Appl. Phys. Lett., vol. 78, no. 12, pp. 1787-1789, March 2001.

In an embodiment, a metrology tool 25 according to any of the embodiments described above is provided as part of a lithography system 50, as depicted schematically in FIG. 17. The lithography system 50 comprises a lithographic apparatus LA configured to define a pattern for forming a target structure 19 on a substrate W and the metrology tool 25.

Further embodiments according to the present invention are described in below numbered clauses:

1. A method of determining information about a target structure formed on a substrate using a lithographic process, comprising:
   providing a cantilever probe, the cantilever probe comprising a cantilever arm and a probe element, the probe element extending from the cantilever arm towards the target structure;
   generating ultrasonic waves in the cantilever probe, the ultrasonic waves propagating through the probe element into the target structure and reflecting back from the target structure into the probe element or into a further probe element extending from the cantilever arm; and detecting the reflected ultrasonic waves and determining information about the target structure from the detected reflected ultrasonic waves.
2. The method of clause 1, wherein the ultrasonic waves are generated in the cantilever probe using the photoacoustic effect.
3. The method of clause 2, wherein the generation of the ultrasonic waves is performed by directing a laser beam onto the cantilever probe.
4. The method of clause 3, wherein an ultrasound generation layer is provided on the cantilever arm and the laser beam is directed onto the ultrasound generation layer to generate ultrasonic waves in the ultrasound generation layer.
5. The method of clause 4, wherein the ultrasound generation layer comprises a metallic material.
6. The method of clause 4 or 5, wherein the composition and dimensions of the ultrasound generation layer are selected so that at least a portion of the ultrasonic waves generated in the ultrasound generation layer have a frequency higher than 15 GHz.
7. The method of any of clauses 4-6, wherein a thickness of the ultrasound generation layer is less than 500 nm.
8. The method of any preceding clause, wherein the detection of the reflected ultrasonic waves comprises detecting changes in an optical reflectivity of the cantilever probe.
9. The method of any preceding clause, wherein the reflected ultrasonic waves are detected at plural positions of the cantilever probe relative to the target structure.
10. The method of any preceding clause, wherein the target structure comprises a first sub-structure overlying a second sub-structure.
11. The method of clause 10, wherein:
   a profile of the first sub-structure is obtained by measuring deflection of the cantilever arm caused by interaction between the probe element and the first sub-structure for a plurality of positions of the probe element relative to the first sub-structure; and
   information about the second sub-structure is obtained from the detected reflected ultrasonic waves.
12. The method of clause 10 or 11, wherein the information about the target structure comprises information about overlay between the first sub-structure and the second sub-structure, the overlay representing a degree of misalignment between the first sub-structure and the second sub-structure.
13. The method of clause 12, wherein:
   the first sub-structure and the second sub-structure each comprise a plurality of repeating elements; and
   the reflected ultrasonic waves are detected at each of a set of positions of the target structure relative to the cantilever probe, each position of the target structure relative to the cantilever probe being a position at which the probe element is aligned with a peak of a different one of the repeating elements of the first sub-structure.
14. The method of clause 13, wherein the alignment of the probe element with each repeating element is determined by measuring a deflection of the cantilever arm caused by interaction between the probe element and the first sub-structure.
15. The method of clause 13 or 14, wherein:
   the first sub-structure has a different pitch to the second sub-structure, such that a variation with position of the probe element relative to the target structure of an intensity of ultrasonic waves reflected from the target structure comprises a beating term having a frequency defined by a difference between the pitches of the first sub-structure and the second sub-structure and a phase defined by the overlay; and
   the phase of the beating term is detected and used to determine the overlay.
16. The method of any of clauses 12-14, wherein:
   the target structure comprises a first sub-target and a second sub-target;
   the first sub-target and the second sub-target each comprise two sub-structures with a deliberately applied overlay bias between the two sub-structures; and
   the overlay bias of the first sub-target is different to the overlay bias of the second sub-target.
17. The method of clause 16, wherein the overlay bias of the first sub-target is equal to and opposite to the overlay bias of the second sub-target.
18. The method of clause 17, wherein:
   the two sub-structures of the first sub-target and the two sub-structures of the second sub-target have the same pitch p;
   the overlay bias of the first sub-target is +p/4; and
   the overlay bias of the second sub-target is -p/4.
19. The method of any of clauses 16-18, wherein overlay is determined from a difference between:
   an intensity of a detected reflected ultrasonic wave from the first sub-target when the probe element is aligned with a peak of a repeating element of the sub-structure closest to the probe element of the first sub-target; and
   an intensity of a detected reflected ultrasonic wave from the second sub-target when the probe element is aligned with a peak of a repeating element of the sub-structure closest to the probe element of the second sub-target.
20. The method of 16, wherein:
   the target structure further comprises a third sub-target and a fourth sub-target;
   the third sub-target and the fourth sub-target each comprise two sub-structures with a deliberately applied overlay bias between the two sub-structures; and the overlay biases of the first sub-target, second sub-target, third sub-target and fourth sub-target are all different from each other.

21. The method of clause 20, wherein:
the two sub-structures of each of the first sub-target, second sub-target, third sub-target and fourth sub-target have the same pitch p;
the overlay bias of the first sub-target is −A+B;
the overlay bias of the second sub-target is A+B;
the overlay bias of the third sub-target is −A−B;
the overlay bias of the fourth sub-target is A−B;
A and B are constants; and
the overlay is determined from a combination of $I_1$, $I_2$, $I_3$, and $I_4$, wherein:
$I_1$ is an intensity of a detected reflected ultrasonic wave from the first sub-target when the probe element is aligned with a peak of a repeating element of the sub-structure closest to the probe element of the first sub-target;
$I_2$ is an intensity of a detected reflected ultrasonic wave from the second sub-target when the probe element is aligned with a peak of a repeating element of the sub-structure closest to the probe element of the second sub-target;
$I_3$ is an intensity of a detected reflected ultrasonic wave from the third sub-target when the probe element is aligned with a peak of a repeating element of the sub-structure closest to the probe element of the third sub-target; and
$I_4$ is an intensity of a detected reflected ultrasonic wave from the fourth sub-target when the probe element is aligned with a peak of a repeating element of the sub-structure closest to the probe element of the fourth sub-target.

22. The method of clause 21, wherein:

$$A = p/4;$$

and
the overlay ov is determined by $$ov = \frac{I_1 - I_2 + I_3 - I_4}{I_1 - I_2 - I_3 + I_4} \cdot B.$$

23. The method of clause 12, wherein:
the first sub-structure is displaced laterally relative to the second sub-structure so that at least a portion of the second sub-structure does not overlap with any of the first sub-structure when viewed perpendicularly to a plane of the substrate;
a profile of the first sub-structure is obtained by measuring deflection of the cantilever arm caused by interaction between the probe element and the first sub-structure for a plurality of positions of the probe element relative to the first sub-structure; and
a profile of the second sub-structure is obtained by detecting the reflected ultrasonic waves for a plurality of positions of the probe element relative to the second sub-structure within the portion of the second sub-structure that does not overlap with any of the first sub-structure.

24. The method of any preceding clause, wherein:
the cantilever probe comprises both the probe element and the further probe element; and
the reflected ultrasonic waves are detected predominantly via the further probe element.

25. The method of clause 24, wherein the probe element is configured to direct the ultrasonic waves into the target structure at a position that is different from a position from which the further probe element receives the reflected ultrasonic waves.

26. The method of clause 24 or 25, wherein:
at least a portion of the probe element is tapered to have a cross-sectional area that decreases towards the target structure; and
at least a portion of the further probe element is tapered to have a cross-sectional area that increases towards the target structure.

27. The method of any of clauses 1-23, wherein the reflected ultrasonic waves are detected predominantly via the probe element.

28. The method of clause 27, wherein:
the ultrasonic waves propagating towards the target structure pass predominantly through a first portion of the probe element; and
the reflected ultrasonic waves propagating away from the target structure pass predominantly through a second portion of the probe element, different from the first portion.

29. The method of clause 28, wherein the first portion and the second portion are formed from different materials.

30. The method of clause 29, wherein the first portion comprises an outer sheath region and the second portion comprises a central region inside the outer sheath region, the central region and the outer sheath region being configured to act as a waveguide for reflected ultrasonic waves propagating from the target structure back through the probe element towards the cantilever arm, such that the reflected ultrasonic waves propagate predominantly through the central region of the probe element.

31. The method of any of clauses 28-30, wherein at least a portion of the first portion is tapered to have a cross-sectional area that decreases towards the target structure.

32. The method of any of clauses 28-31, wherein at least a portion of the second portion is tapered to have a cross-sectional area that decreases towards the cantilever arm.

33. The method of any preceding clause, wherein:
the probe element comprises a longitudinally proximal portion and a longitudinally distal portion;
the longitudinally proximal portion is connected to the cantilever arm and extends from the cantilever arm to the longitudinally distal portion; and
the longitudinally distal portion extends from the longitudinally proximal portion towards the target structure, wherein:
the longitudinally distal portion is tapered to have a cross-sectional area that decreases towards the target structure and the longitudinally proximal portion comprises at least a portion that is not tapered or at least a portion that is tapered to have a cross-sectional area that decreases towards the cantilever arm.

34. The method of clause 33, wherein the longitudinally proximal portion comprises a portion that is tapered to have a cross-sectional area that decreases towards the cantilever arm and a portion that is tapered to have a cross-sectional area that decreases towards the target structure.

35. The method of clause 33 or 34, wherein the longitudinally proximal portion has a constant cross-sectional area from the longitudinally distal portion to the cantilever arm.

36. The method of any of clauses 1-35, wherein:
the cantilever probe comprises a plurality of the cantilever arms, each cantilever arm having a respective probe element extending from the cantilever arm towards the target structure;
the generating of ultrasonic waves in the cantilever probe causes ultrasonic waves to propagate through each respective probe element into the target structure; and
the detecting of reflected ultrasonic waves comprises detecting reflected ultrasonic waves from each of the respective probe elements.

37. The method of clause 36, wherein:
the generating of ultrasonic waves is performed using the photoacoustic effect driven by a laser beam; and
the laser beam is optically processed to provide a structured illumination that matches a spatial distribution of the plurality of cantilever arms.

38. The method of clause 37, wherein the optical processing is performed by diffraction.

39. The method of clause 37, wherein the optical processing is performed using an array of individually controllable elements.

40. The method of any of clauses 36-39, wherein the detecting of reflected ultrasonic waves comprises directing a probe beam of radiation onto the cantilever arms and detecting radiation reflected from the cantilever arms.

41. The method of clause 40, wherein the probe beam is optically processed to provide a structured illumination that matches a spatial distribution of the plurality of cantilever arms.

42. The method of clause 41, wherein the optical processing of the probe beam is performed using an array of individually controllable elements.

43. The method of clause 40, wherein the probe beam is focused into a line focus intersecting the plurality of cantilever arms.

44. The method of any of clauses 40-43, wherein the radiation reflected from each of the cantilever arms is detected in parallel.

45. A metrology tool for determining information about a target structure formed on a substrate using a lithographic process, the metrology tool comprising:
a cantilever probe having a cantilever arm and a probe element, the probe element configured to extend from the cantilever arm towards the target structure;
an ultrasound generation system configured to generate ultrasonic waves in the cantilever probe, such that the ultrasonic waves propagate through the probe element into the target structure and reflect back from the target structure into the probe element or into a further probe element extending from the cantilever arm; and
an ultrasound detection system configured to detect the reflected ultrasonic waves.

46. The metrology tool of clause 45, wherein:
the cantilever probe comprises a plurality of the cantilever arms, each cantilever arm having a respective probe element configured to extend from the cantilever arm towards the target structure;
the ultrasound generation system is configured to cause ultrasonic waves to propagate through each respective probe element into the target structure; and
the ultrasound detection system is configured to detect reflected ultrasonic waves from each of the respective probe elements.

47. A cantilever probe for use in a metrology tool for determining information about a target structure formed on a substrate using a lithographic process, the cantilever probe comprising:
a cantilever arm;
a probe element configured to extend from the cantilever arm towards the target structure; and
a further probe element configured to extend from the cantilever arm towards the target structure, wherein:
at least a portion of the probe element is tapered to have a cross-sectional area that decreases towards the target structure; and
at least a portion of the further probe element is tapered to have a cross-sectional area that increases towards the target structure.

48. A cantilever probe for use in a metrology tool for determining information about a target structure formed on a substrate using a lithographic process, the cantilever probe comprising:
a cantilever arm; and
a probe element configured to extend from the cantilever arm towards the target structure, wherein:
the probe element comprises a first portion and a second portion, the first portion and the second portion being formed from different materials;
the first portion comprises an outer sheath region and the second portion comprises a central region inside the outer sheath region, the central region and the outer sheath region being configured to act as a waveguide for ultrasonic waves propagating from the target structure through the probe element towards the cantilever arm.

49. The probe of clause 48, wherein at least a portion of the outer sheath region is tapered to have a cross-sectional area that decreases towards the target structure.

50. The probe of clause 48 or 49, wherein at least a portion of the second portion is tapered to have a cross-sectional area that decreases towards the cantilever arm.

51. A cantilever probe for use in a metrology tool for determining information about a target structure formed on a substrate using a lithographic process, the cantilever probe comprising:
a cantilever arm; and
a probe element configured to extend from the cantilever arm towards the target structure, wherein:
the probe element comprises a longitudinally proximal portion and a longitudinally distal portion;
the longitudinally proximal portion is connected to the cantilever arm and extends from the cantilever arm to the longitudinally distal portion; and
the longitudinally distal portion is configured to extend from the longitudinally proximal portion towards the target structure, wherein:
the longitudinally distal portion is tapered to have a cross-sectional area that decreases towards the target structure and the longitudinally proximal portion comprises at least a portion that is not tapered or at least a portion that is tapered to have a cross-sectional area that decreases towards the cantilever arm.

52. A lithography system, comprising:
a lithographic apparatus configured to define a pattern for forming a target structure on a substrate; and
the metrology tool of clause 45.

The invention claimed is:
1. A method of determining information about a target structure disposed on a substrate using a lithographic process, comprising:

positioning a cantilever probe adjacent to the target structure, the cantilever probe comprising a cantilever arm and a probe element, the probe element extending from the cantilever arm towards the target structure, wherein the target structure comprises:
- a first sub-target and a second sub-target, wherein the first sub-target and the second sub-target each comprise two sub-structures with a deliberately applied overlay bias between the two sub-structures; and
- a third sub-target and a fourth sub-target, wherein the third sub-target and the fourth sub-target each comprise two sub-structures with a deliberately applied overlay bias between the two sub-structures,
- wherein the overlay biases of the first sub-target, second sub-target, third sub-target and fourth sub-target are all different from each other;

generating ultrasonic waves in the cantilever probe, the ultrasonic waves propagating through the probe element into the target structure and reflecting back from the target structure into the probe element or into a further probe element extending from the cantilever arm;

detecting the reflected ultrasonic waves; and determining information about the target structure from the detected reflected ultrasonic waves, wherein the information about the target structure comprises information about overlay between the two sub-structures of the first, second, third, and/or fourth sub-targets, and wherein the overlay represents a degree of misalignment between the two sub-structures.

2. The method of claim 1, wherein:
a profile of one of the two sub-structures is obtained by measuring a deflection of the cantilever arm caused by interaction between the probe element and that sub-structure for a plurality of positions of the probe element relative to that sub-structure; and
information about a further one of the two sub-structures is obtained from the detected reflected ultrasonic waves.

3. The method of claim 1, wherein the overlay bias of the first sub-target is equal to and opposite to the overlay bias of the second sub-target.

4. The method of claim 3, wherein:
the two sub-structures of the first sub-target and the two sub-structures of the second sub-target have the same pitch p;
the overlay bias of the first sub-target is +p/4; and
the overlay bias of the second sub-target is −p/4.

5. The method of claim 1, wherein overlay is determined from a difference between:
an intensity of a detected reflected ultrasonic wave from the first sub-target when the probe element is aligned with a peak of a repeating element of one of the two sub-structures closest to the probe element of the first sub-target; and an intensity of a detected reflected ultrasonic wave from the second sub-target when the probe element is aligned with a peak of a repeating element of one of the two sub-structure closest to the probe element of the second sub-target.

6. The method of claim 1, further comprising:
aligning the probe element with a peak of a repeating element of one of the two sub-structures closest to the probe element of the first sub-target and determining a first intensity of a detected reflected ultrasonic wave from the first sub-target;
aligning the probe element with a peak of a repeating element of one of the two sub-structure closest to the probe element of the second sub-target and determining a second intensity of a detected reflected ultrasonic wave from the second sub-target; and
determining overlay based on a difference between first and the second intensities.

7. The method of claim 1, wherein:
the two sub-structures of each of the first sub-target, second sub-target, third sub-target and fourth sub-target have the same pitch p, wherein A and B are constants;
the overlay bias of the first sub-target is −A+B;
the overlay bias of the second sub-target is A+B;
the overlay bias of the third sub-target is −A−B;
the overlay bias of the fourth sub-target is A−B; and
the overlay is determined from a combination of $I_1$, $I_2$, $I_3$, and $I_4$, wherein:
$I_1$ is an intensity of a detected reflected ultrasonic wave from the first sub-target when the probe element is aligned with a peak of a repeating element of the sub-structure closest to the probe element of the first sub-target;
$I_2$ is an intensity of a detected reflected ultrasonic wave from the second sub-target when the probe element is aligned with a peak of a repeating element of the sub-structure closest to the probe element of the second sub-target;
$I_3$ is an intensity of a detected reflected ultrasonic wave from the third sub-target when the probe element is aligned with a peak of a repeating element of the sub-structure closest to the probe element of the third sub-target; and
$I_4$ is an intensity of a detected reflected ultrasonic wave from the fourth sub-target when the probe element is aligned with a peak of a repeating element of the sub-structure closest to the probe element of the fourth sub-target.

8. The method of claim 7, wherein:
A=p/4; and
the overlay ov is determined by $$ov = \frac{I_1 - I_2 + I_3 - I_4}{I_1 - I_2 - I_3 + I_4} \cdot B.$$

* * * * *